US007105875B2

(12) United States Patent
Singh

(10) Patent No.: US 7,105,875 B2
(45) Date of Patent: Sep. 12, 2006

(54) LATERAL POWER DIODES

(75) Inventor: Ranbir Singh, Gaithersburg, MD (US)

(73) Assignee: Wide bandgap, LLC, South Riding, VA (US)

( * ) Notice: Subject to any disclaimer, the term of this patent is extended or adjusted under 35 U.S.C. 154(b) by 64 days.

(21) Appl. No.: 10/859,567

(22) Filed: Jun. 3, 2004

(65) Prior Publication Data

US 2005/0280114 A1    Dec. 22, 2005

(51) Int. Cl.
   *H01L 27/148* (2006.01)
(52) U.S. Cl. .......................... 257/220; 257/76; 257/77; 257/78; 257/48; 257/284; 438/105; 438/931
(58) Field of Classification Search ................ 257/502, 257/284, E21.054, 76–79
See application file for complete search history.

(56) References Cited

U.S. PATENT DOCUMENTS

| | | | |
|---|---|---|---|
| 5,264,713 A | 11/1993 | Palmour | |
| 6,281,521 B1 | 8/2001 | Singh | |
| 6,465,863 B1 * | 10/2002 | Deboy et al. | 257/495 |
| 6,573,128 B1 * | 6/2003 | Singh | 438/167 |
| 6,600,375 B1 | 7/2003 | Morse et al. | |
| 6,693,308 B1 * | 2/2004 | Sankin et al. | 257/103 |
| 6,703,684 B1 * | 3/2004 | Udrea et al. | 257/548 |
| 2001/0024138 A1 | 9/2001 | Dohnke et al. | |
| 2002/0190258 A1 | 12/2002 | Harada et al. | |
| 2003/0168704 A1 | 9/2003 | Harada et al. | |
| 2003/0168919 A1 | 9/2003 | Friedrichs et al. | |

OTHER PUBLICATIONS

J Hwang et al. "Improving Breakdown Voltage of SiC/Si Heterojunction with Graded Structure by Rapid Thermal CVD Technology" IEEE Transactions on electron devices, vol. 44, No. 11, Nov. 1997.*
Koo, Sang-Mo "Design and Process Issues of Junction-and Ferroelectric-Field Effect Transistors in Silicon Carbide" ISRN KTH/EKT/FR-2003/1-SE, KTH, royal institute of technology, 2003.*
C Hatfield et al., "DC 1-V Characteristics and RF Performance of a 4H-SiC JFET at 773K," IEEE Transactions on Electron Devices, vol. 45, No. 9, Sep. 1998.
D. Alok et al., "4H-SiC RF Power MOSFETS," IEEE Electron Device Letters, vol. 22, No. 12, Dec. 2001.
R. Singh et al., "High Temperature SiC Trench Gate p-IGBTs," IEEE Transactions on Electron Devices, vol. 50, No. 3, Mar. 2003.
S. Banerjee et al., "1300-V 6H-SiC Lateral MOSFETs with two RESURF Zone," IEEE Electron Device Letters, vol. 23, No. 10, Oct. 2002.
R. Singh et al., "SiC Power Schottky and PiN Diodes,"IEEE Transactions on Electron Devices, vol. 49, No. 4, Apr. 2002.

(Continued)

*Primary Examiner*—Mary Wilczewskl
*Assistant Examiner*—Tsz Chiu
(74) *Attorney, Agent, or Firm*—Andrew Bodendorf

(57) ABSTRACT

A lateral power diodes with an optimal drift doping formed in widebandgap semiconductors like Silicon Carbide, Aluminum Nitride and Gallium Nitride and Diamond are provided with a voltage rating greater 200V. Contrary to conventional vertical design of power diodes, a higher, optimum doping for a given thickness is critical in supporting higher anode/cathode blocking voltage, and lower on-resistance than vertical drift region designs. The backside contact and the anode junction must be able to support the rated blocking voltage of the device.

43 Claims, 8 Drawing Sheets

OTHER PUBLICATIONS

R. Singh et al., "Development of High-Current 4H-SiC ACCUFET," IEEE Transactions on Electron Devices, vol. 50, No. 2, Feb. 2003.

Trew et al., "The Potential of Diamond and SiC Electronic Devices for Microwave and Millimeter-Wave Power Applications," Proceedings of the IEEE, vol. 79, No. 5, May 1991.

Clarke et al., "SiC Microwave Power Technologies," Proceedings of the IEEE, vol. 90, No. 6, May 2002.

B. Jayant Baliga, "Trends in Power Semiconductor Devices," IEEE Transactions on Electron Devices, vol. 43, No. 10, Oct. 1996.

Friedricks et al., "Stacked high voltage switch based on SiC VJEFTs," ISPSD, Cambridge, UK, Apr. 14-17, 2003.

G. Kelner et al., "High Temperature Operation of a-Silcon Carbide Buried Gate Junction Field-Effect Transistors," Electronics Letters, vol. 27, No. 12, Jun. 6, 1991.

Meneghesso et al., "Trap Characterization in Buried-Gate N-Channel 6H-SiC JFETs," IEEE Electron Device Letters, vol. 22, No. 9, Sep. 2001.

Rozario et al., "Thermal Cycling Study of SiC BGJFETs," IEEE 1998.

B. Weis et al., "Turn-off and short curcuit behaviour of 4H SiC JFETs," IEEE 2001.

* cited by examiner

LATERAL POWER DIODES

TECHNICAL FIELD

The following description relates generally to semiconductor devices, and in particular to power and microwave diodes using widebandgap semiconductors.

BACKGROUND

Most conventional semiconductor power diodes are almost exclusively formed using silicon (Si). Due to the relative maturity of the use of this semiconductor, the performance of conventional power diodes to carry high currents and block high voltages is closely approaching the theoretical limit for Si. For example, power PiN and Schottky diodes made using Si have undergone many improvements over the past two decades allowing them to block 30 to 1200 volts while providing low on-state resistance values. However, the blocking voltage offered by Si limits the application of schottky diodes to about 250 V (because they rely on drift current transport). Therefore, high voltage devices require the use of bipolar PiN diodes. While PiN diodes provide acceptable on-state performance, they suffer from slower switching speeds.

There are many applications for power diodes that require the ability to carry high currents and block voltages in the range of 600 V to 15 kV (and greater). These applications include motor control, power supply, lighting ballast, power transmission and generation, and utility power conversion. Unfortunately, the overall performance of power diodes made using Si is poor for this voltage range, and the lack of such power diodes represents the primary limitation in realizing circuits for these applications. In fact, if high voltage diodes that support such high currents and operate at frequencies of one to 100 kHz were available, they would revolutionize power utility applications and result in substantial power savings.

SUMMARY

In one general aspect, a lateral power diode (LPD) includes a substrate; one or more layers including at least one layer of a widebandgap semiconductor having a first conductivity type, the one or more layers formed on the substrate layer; a resurf layer of the widebandgap semiconductor having a second conductivity type formed on the at least one layer; of the first conductivity type a sub-anode terminal formed on the substrate layer; a schottky anode terminal in contact with the resurf layer; a cathode region in contact with the resurf layer spaced apart from the anode; and a current conduction path in the resurf layer between the anode terminal and the cathode region.

The LPD has a lateral breakdown voltage between the anode and the cathode region and a vertical breakdown voltage between the cathode region and the sub-anode, wherein the lateral breakdown voltage is less than or equal to the vertical breakdown voltage. The LPD may have a blocking voltage of 600 V to 25 kV.

The substrate layer may have a carrier concentration of dopant atoms of 0 $cm^{-3}$ to $1 \times 10^{22}$ $cm^{-3}$. The substrate layer has a thickness of 100 to 500 µm. The resurf layer may have a carrier concentration of dopant atoms of $1 \times 10^{15}$ $cm^{-3}$ to $1 \times 10^{19}$ $cm^{-3}$ and a thickness of 0.01 to 5 µm.

The at least one layer of the first conductivity may have a carrier concentration of dopant atoms of less than $10^{17}$ $cm^{-3}$.

The semiconductor may have a bandgap EG greater than 2 eV and less than 8 eV and be formed using one of silicon carbide, diamond, aluminum nitride, and gallium nitride.

The LPD may have a specific on resistance of less than 300 mΩ-$cm^2$.

In one implementation, the first conductivity type is p type and the second conductivity type is n type.

In another general aspect, the LPD may include a compensating layer of the second conductivity type the resurf layer configured to shape a lateral electric field of the LPD.

The resurf layer may have a substantially stepwise increasing dose profile of the second conductivity type from the schottky anode to the cathode region.

The LPD also may include an expitaxially grown (or ion implanted) extension of resurf layer of the second conductivity type between the schottky anode and the cathode region, where the extension provides a substantially increasing dose profile of the second conductivity type from the schottky anode to the cathode region.

In another general aspect, a LPD includes a substrate layer; one or more layers including at least one layer of the widebandgap semiconductor having a first conductivity type formed on the substrate layer a resurf layer of the widebandgap semiconductor having a second conductivity type formed on the at least one layer; of the first conductivity type a sub-anode terminal formed on the substrate layer; a anode region in contact with the resurf layer having the first conductivity type; a cathode region, in contact with the resurf layer and spaced apart from the anode terminal, having the second conductivity type; and a current conduction path in the resurf layer between the anode region and the cathode region.

In one implementation, the first conductivity type is p type and the second conductivity type is n type.

The LPD may have a lateral breakdown voltage between the anode region and the cathode region and a vertical breakdown voltage between the cathode region and the sub-anode terminal, wherein the lateral breakdown voltage is less than or equal to the vertical breakdown voltage.

The LPD may have a blocking voltage of 1200 V to 25 kV.

The substrate layer may have a carrier concentration of dopant atoms of 0 $cm^{-3}$ to $1 \times 10^{22}$ $cm^{-3}$ and have a thickness of 100 to 500 µm.

The resurf layer may have a carrier concentration of dopant atoms of $1 \times 10^{15}$ $cm^{-3}$ to $1 \times 10^{19}$ $cm^{-3}$ and a thickness of 0.01 to 5 µm.

The at least one layer of the first conductivity type may have a carrier concentration of dopant atoms of less than $10^{17}$ $cm^{-3}$ and a thickness of 0.1 to 200 µm.

In another general aspect, a LPD may include one or more layers of the widebandgap semiconductor having a first conductivity type and a first and a second surface; one or more layers of the widebandgap semiconductor having a second conductivity type formed in contact with the first surface of the one or more layers of the first conductivity type including at least a resurf layer having a doping profile uniformly decreasing with depth; a sub-anode formed in contact with the second surface of the one or more layers of the first conductivity; an anode region in contact with the resurf layer; a cathode region in contact with the resurf layer spaced apart from the anode region; and a lateral current conduction path in the one or more layers of the second conductivity type between the anode region and the cathode region.

The doping $N_{resurf}$ of the resurf layer by thickness of the resurf layer is expressed as a range of plus or minus 50% as governed by the following equation:

$$\frac{1}{L_{Drift}} \int_0^{t_{resurf}} \int_0^{L_{Drift}} N_{resurf}(x, y) \partial x \partial y = \frac{\varepsilon \times E_{cr}}{q},$$

where $E_{cr}$ is the critical breakdown electric field of the semiconductor, $\in$ is the dielectric constant of the semiconductor, 'q' is the electronic charge, and $L_{Drift}$ is the distance between the cathode region and the anode region.

The anode region may be located at a distance $L_{Drift}$ from the cathode region where $L_{Drift}$ is expressed as:

$$L_{Drift} = \frac{(\text{Between 2 and 1}) \times BV_{Lat}}{E_{cr}},$$

where $BV_{lat}$ is the lateral breakdown voltage between anode and cathode and $E_{cr}$ is the critical electric field of the semiconductor.

Other features will be apparent from the description, the drawings, and the claims.

DESCRIPTION OF DRAWINGS

Like reference symbols in the various drawings indicate like elements.

DETAILED DESCRIPTION

The following description of the various implementations and embodiments illustrates general concepts of the invention which may suggest various alternatives to those skilled in the art. For example, the description makes reference to certain layers and regions being formed of a first conductivity type (e.g., n-type) and a second conductivity type (e.g., p-type) in addition to various dopings (e.g., + and −) of these areas. However, complementary devices also may be produced according to the descriptions below, such as, for example, the first conductivity type may be a p-type semiconductor and the second conductivity type may be an n-type semiconductor.

The various layers and regions may be fabricated using a number of conventional semiconductor fabrication techniques including solid source crystal growth, molecular beam epitaxy, gas source metal-organic chemical vapor deposition, wafer bonding, lithography, thermal oxidation, metallization, etching, and/or combinations thereof.

It also will be appreciated that the figures show general concepts and that sizes and dimensions of layers or regions may be exaggerated for illustrative purposes to show general structures, and are not necessarily to scale. In addition, references to a layer being formed on another layer or substrate may contemplate that additional layers intervene. Likewise, a referenced layer may include implementations formed of multiple layers or doping regions.

Lateral Power Diode Structure

The device structures described below are for fabrication in all semiconductors with a bandgap (EG) greater than or equal to approximately 2 eV and less than or equal to approximately 8 eV. For example, this includes silicon carbide (with EG range of 2.1 eV to 4 eV), diamond (EG 5 eV), aluminum nitride (EG 6.1 eV), and gallium nitride (with EG range 3 eV to 5 eV). In addition, all faces of the crystal structure of these semiconductors may be used. For example, faces for SiC include the 0001 plane (i.e., the silicon face) or the 000-1 (i.e., the carbon face), but intermediate faces like 11–20 may also be used for the fabrication of LPD. The carbon face may offer additional benefits because of the lower temperatures needed to oxidize that face of SiC (making the carbon face particularly suitable for processing in conventional Si foundries).

Figure 1:
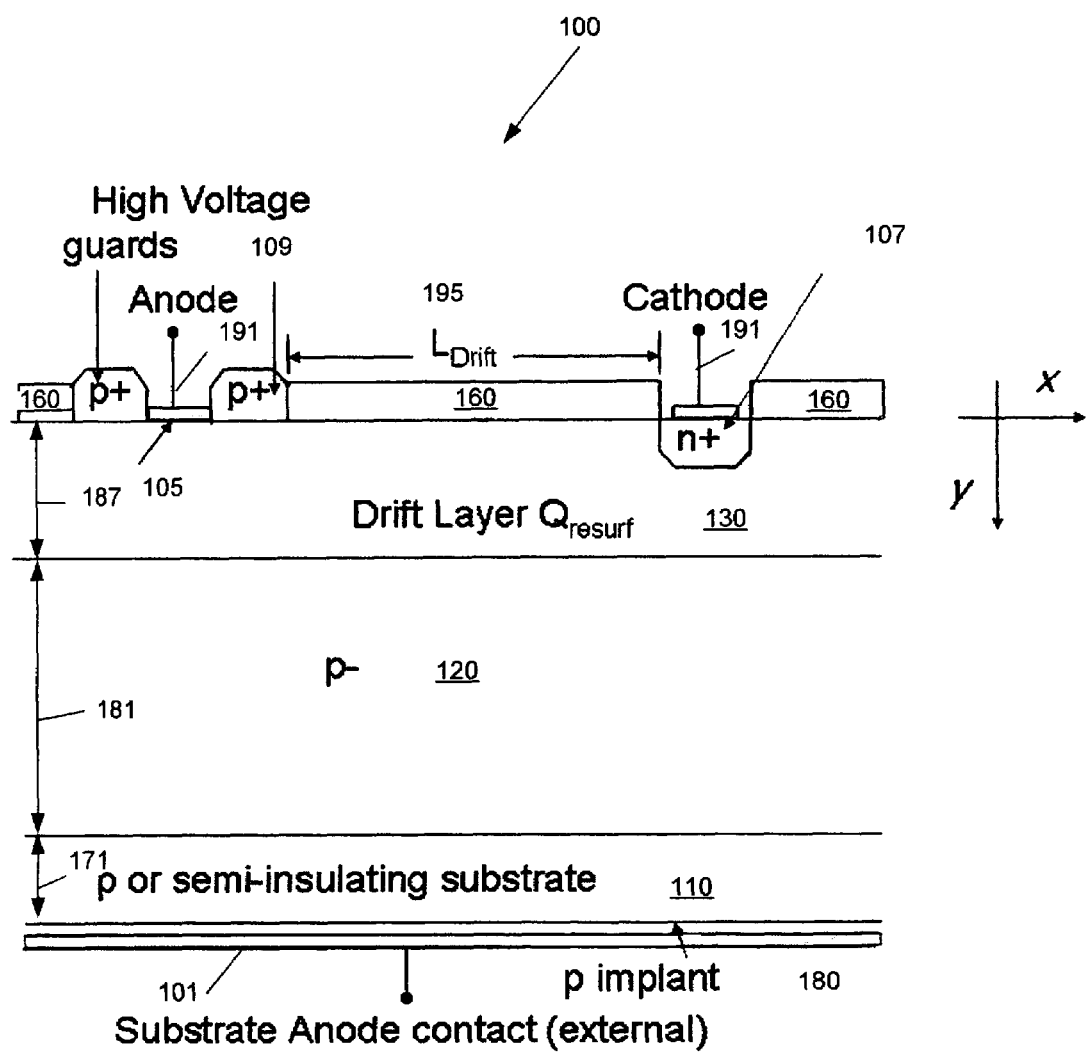
FIG. 1 shows an exemplary cell of a lateral power diode structure having an optimally doped conduction path between the anode and the cathode.

FIG. 1 shows the structure of a lateral power diode (LPD) with a schottky anode contact. As shown by the exemplary implementation illustrated in FIG. 1, a cell 100 of the LPD includes an external substrate anode (sub-anode) contact 101 with an optimally doped conduction path between a schottky contact anode 105 and an ohmic region cathode 107. The cell 100 may include up to three or more layers including a first layer 110, a second layer 120, and a third layer 130. The schottky contact 105 may be surrounded with a high voltage guard 109. The area between the high voltage guard 109 and the cathode region 107 may be filled with a passivating dielectric 160.

The first layer 110 may be formed using a p-type or n-type substrate having an external substrate contact or sub-anode 101. In one implementation, the layer 110 may have a thickness ($t_{substrate}$) 171 of approximately 100–500 μm with a doping of zero to $10^{22}$ cm$^{-3}$. In another example, the substrate may be formed of a semi-insulating substrate material.

An optional very thin highly doped backside layer 180 of the same conductivity type as layer 110 may be ion implanted in the substrate 110 or epitaxially grown thereon having a thickness of 0.01 to 1 μm and a doping $N_{sub}$ of greater than $10^{17}$ cm$^{-3}$. The highly doped backside layer 180 may be provided to prevent the vertical electric field from reaching the external substrate contact terminal 101.

The second layer 120 may be formed of a low doped p-type conductivity semiconductor between layer 110 and layer 130. The layer 120 may be grown (e.g., using a high quality epitaxial process) on layer 110 to a thickness ($t_{backgate}$) 181 of one to 200 μm with an acceptor doping $N_A$. If layer 110 has a doping less than or equal to $10^{17}$ cm$^{-3}$, layer 120 is optional. However, when the doping of layer 110 exceeds $10^{17}$ cm$^{-3}$, layer 120 should be included with a doping $N_A$, for example, of $10^{13}$ cm$^{-3}$ to $10^{18}$ cm$^{-3}$. A more precise description of how to determine $N_A$ is given below.

The third layer 130 (i.e., the resurf layer) may be epitaxially grown or implanted with an optimal doping $N_{resurf}$. Tolerance on the doping $N_{resurf}$ and thickness of layer 130

($t_{resurf}$) 187 is roughly plus or minus 50% from the optimal doping calculated using the design equations given below. Layer 130 may be doped from $10^{15}$ cm$^{-3}$ to $10^{19}$ cm$^{-3}$ having a thickness of 0.01 to 1.0 µm.

The anode terminal 191 is formed as a schottky contact at the surface of the drift layer 130. The schottky contact 105 may be surrounded by a high voltage guard region 109 formed using a highly doped p+ area. The guard region 109 may be grown expitaxially or ion implanted with doping greater than $10^{17}$ cm$^{-3}$ with a thickness of 0.01 to 5 µm.

The cathode region 107 may be formed of highly doped n+ area to form a low resistance ohmic contact for the cathode terminal 193. The cathode region 107 may be ion implanted (in layer 130) or epitaxially grown (on layer 130) with doping, for example, greater than $10^{17}$ cm$^{-3}$ with a thickness 189 of 0.01 to 1 µm.

The area between the anode 105 and cathode 107 may be filled with an appropriate passivating dielectric 160, such as, for example, silicon dioxide, silicon nitride, polyimide, deposited SiC, deposited diamond, or other high-k dielectrics. The length 195 (i.e., $L_{drift}$) of the area between the anode 105 and cathode 107 may be determined according to the design conditions described in further detail below.

LPD Design

The resurf layer 130 ensures that the electric field at the surface of layer 130 is sufficiently low (e.g., in one implementation 0 V/cm) when the LPD is blocking its highest voltage (BV). In one implementation, an electric field of 0 V/cm may be maintained at the surface of resurf layer 130 if the electric field at the voltage blocking junction (e.g., the junction between layer 120 and layer 130, and layer 110 and 130 (if layer 120 is not present)) is close to the critical breakdown electric field $E_{cr}$ of the semiconductor. Approximate values for $E_{cr}$ for various semiconductors are:

$E_{cr, Si}$: 0.25 MV/cm
$E_{cr, SiC}$: 2 MV/cm
$E_{cr, C}$: 5 MV/cm

The optimal doping of resurf layer 130 by thickness of the layer 130 may be expressed as:

$$\frac{1}{L_{Drift}} \int_0^{t_{resurf}} \int_0^{L_{Drift}} N_{resurf}(x, y) \partial x \partial y = \frac{\varepsilon \times E_{cr}}{q},$$

where $\in$ is the dielectric constant of the semiconductor (e.g., 11.9×$\in_r$ for Si, 9.7×$\in_r$ for SiC, and 5×$\in_r$ for diamond) where $\in r$ is the permittivity for air (e.g., 8.854×10$^{-14}$ F/cm) and 'q' is the electronic charge (1.60×10$^{-19}$ C). If the doping in the resurf layer 130 is constant along the drift length 195 and its depth (i.e., $t_{resurf}$), the optimum charge in the resurf layer 130 may be expressed as:

$$N_{resurf} \times t_{resurf} = \frac{\varepsilon \times E_{cr}}{q}.$$

Although constant doping is used for the following analysis, uniformly varying doping in the resurf layer 130 may be preferred for a LPD blocking greater than 2 kV and to provide a more uniform electric field in this layer, as explained in further detail below.

The BV (i.e., the highest voltage blocked at the cathode) may be expressed as the lesser of the two:

$BV_{lat}$=(Between 1 and 0.5)×($L_{Drift}$×$E_{cr}$)

(the approximate lateral breakdown condition); and $$BV_{Vert} = \frac{1}{2} \times t_{backgate}\left(E_{cr} + \frac{qN_A}{\varepsilon}t_{backgate} + \frac{1}{2} \times \frac{qN_A^2}{\varepsilon N_{Subs}}t_{backgate}\right)$$

the approximate vertical breakdown condition). These equations express two competing breakdowns: a vertical breakdown and a lateral breakdown. In order to design an LPD with the lowest on-resistance for a given blocking voltage, the vertical blocking voltage should be greater than or equal to the lateral blocking voltage. Approximate formulae for the lateral and the vertical breakdowns are given above. There is a trade-off between the blocking voltage capability of the diode and its on-resistance. In this case, the higher the breakdown voltage, the higher the on-resistance. While these general formulae express the highest voltage blocked by the cathode of the LPD, the actual BV of any given LPD may depend on a variety of factors, such as, for example, fabrication processing, edge termination, and other device dimensions.

Figure 2:
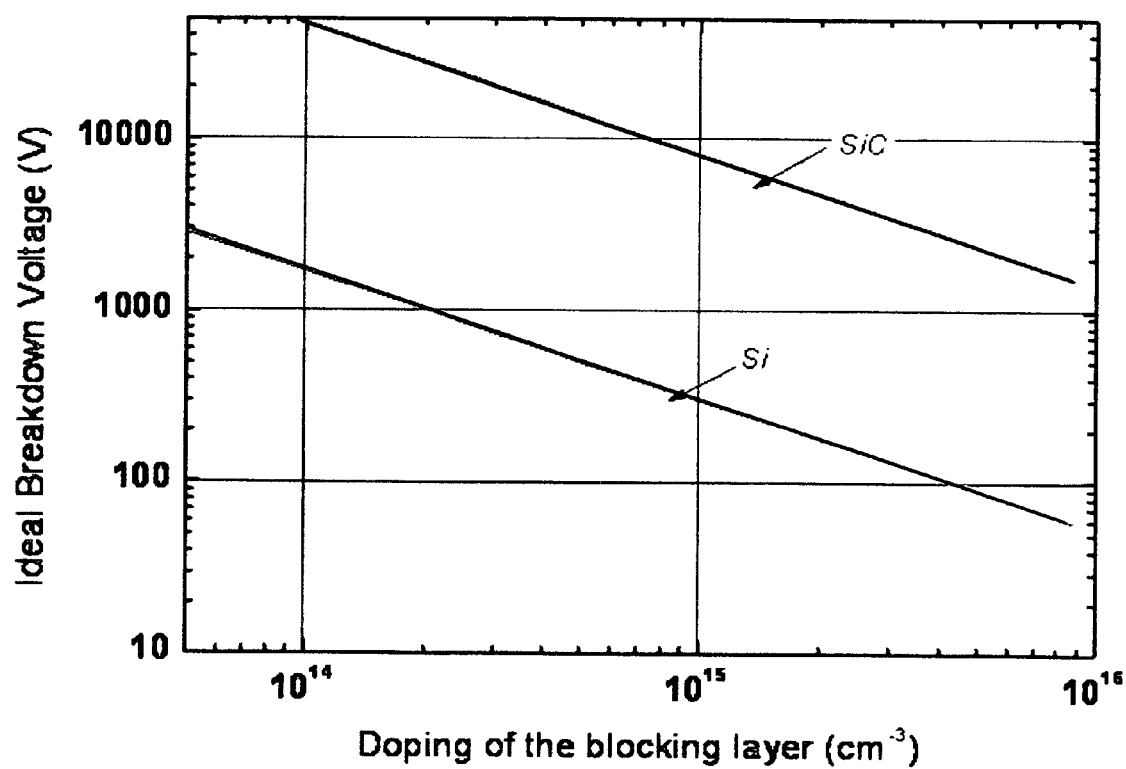
FIG. 2 shows an exemplary illustration of ideal breakdown voltage versus doping of the blocking layer for silicon and silicon carbide.

A comparison of the ideal breakdown voltage verses the doping of the blocking layer (for a vertical formed using Si and SiC) is illustrated in FIG. 2. As shown in FIG. 2, as the doping of the blocking layer is decreased, higher ideal breakdown voltages may be attained for the vertical breakdown condition.

Figure 3:
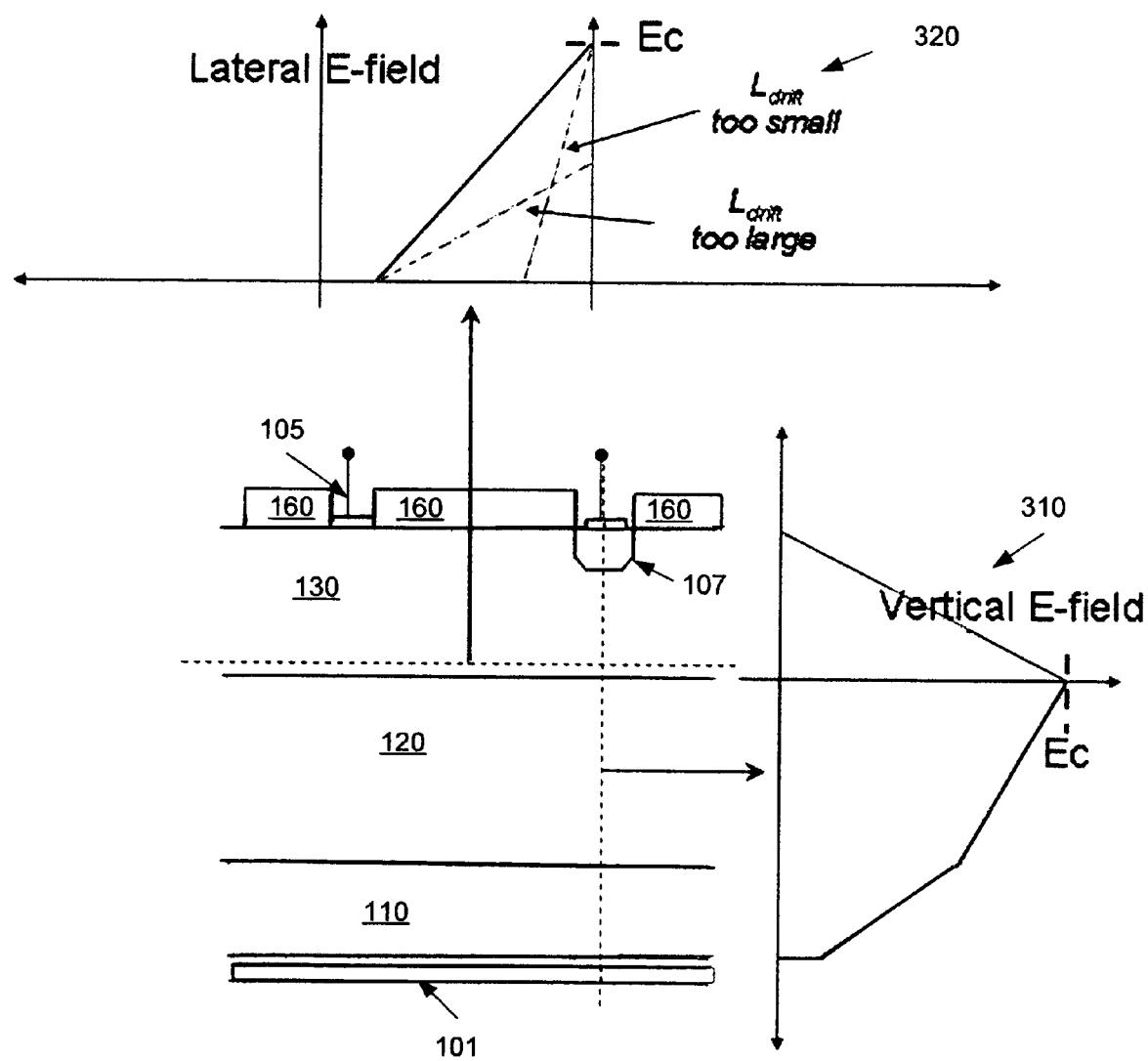
FIG. 3 shows an exemplary lateral power diode structure with illustrations of the vertical and lateral electric fields.

FIG. 3 illustrates several electric fields in a cell 100 of the LPD shown in FIG. 1, when $V_{sub-anode}$=0 V, $V_{anode}$=0 V, and $V_{cathode}$=BV. The vertical electric field 310 along the cathode to sub-anode junction and the lateral electric field 320 close to the PN junction are plotted in FIG. 3. When the cathode voltage is increased, the electric field 310 between the sub-anode to cathode junction increases until it approaches the critical electric field of the semiconductor $E_{cr}$. When the applied cathode voltage causes the sub-anode to cathode junction electric field to exceed $E_{cr}$, the LPD suffers a sub-anode to cathode breakdown (i.e., a vertical breakdown). The lateral breakdown voltage may be determined by the length of the drift region (i.e., $L_{drift}$). $L_{drift}$ may be determined so that the electric field 320 is near zero at the resurf layer when the full BV is applied at the cathode terminal. The electric field along the lateral direction decreases monotonically from the cathode terminal towards the anode, and may be expressed as:

$$E(x) = \frac{qN_{resurf}}{\varepsilon}x,$$

where x=0 corresponds to the location of the anode. A maximum voltage on the cathode is supported with the least drift region resistance for the drift region length 195, which may be expressed as:

$$L_{Drift} = \frac{(\text{Between 2 and 1}) \times BV_{Lat}}{E_{cr}}$$

(assuming vertical breakdown does not occur before BV is achieved). If $L_{Drift}$ is sufficiently long, as specified by this equation, the value of BV is as given previously for the defined lateral breakdown formula.

Layout of the LPD

Figure 4:
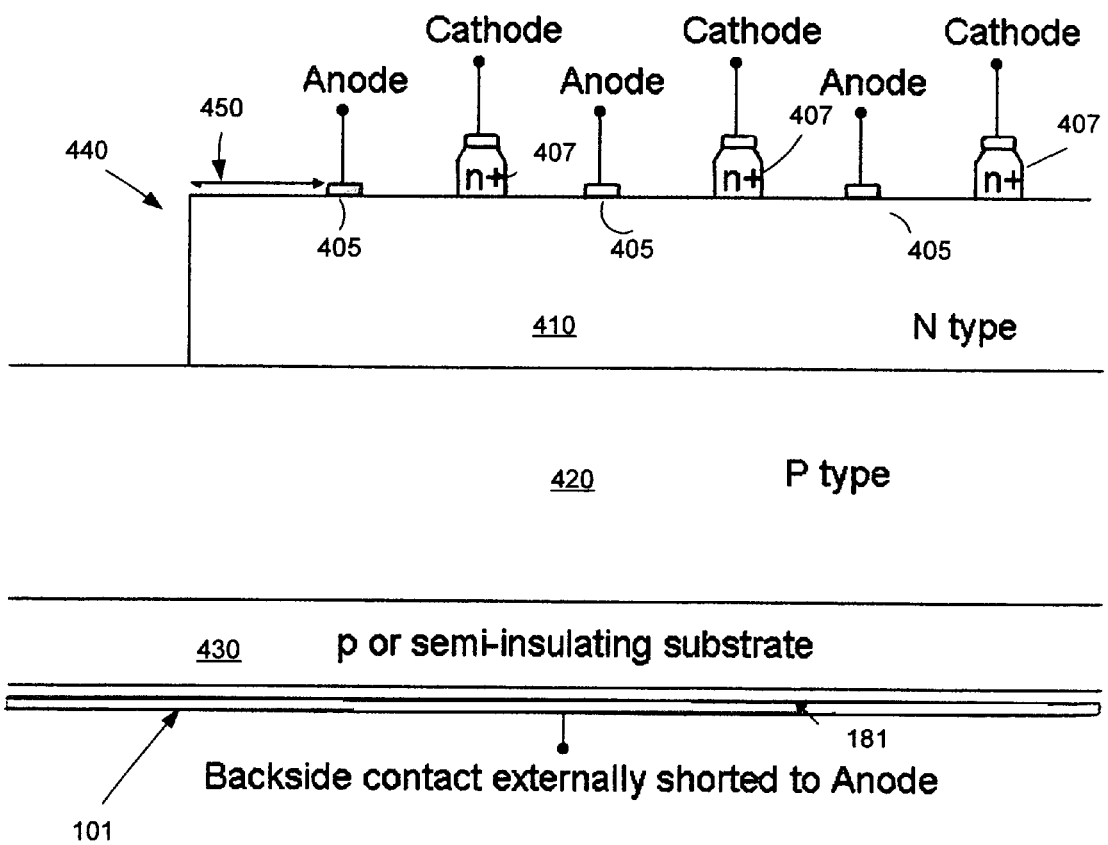
FIG. 4 shows an exemplary lateral power diode formed using the cells of FIG. 1.

The structure of a cell of the LPD is shown in FIG. 1 and described above. However, an entire power diode chip may be formed using multiple cells 100. For example, FIG. 4 shows a schematic diagram of the cell 100 of FIG. 1 repeated and mirror imaged to form a power diode chip 400. As shown in FIG. 4, one or more n type layers 410 are formed on one or more p type layers 420 and/or a substrate 430. In addition, a number of anode regions 405 and cathode regions 407 are formed in contact with the N type layer 410. The outer edge 440 of the one or more N-type layer 410 does not necessarily extend to the edge of the p layer 420 and p substrate 430. To confine the electric field, the edge 440 of top n-type layer 410 (e.g., layer 130 and/or layer 140) may be extended beyond the anode 405 by a predetermined length ($L_{extend}$) 450. $L_{extend}$ may be determined according to the BV rating of the device for which the LPD is to be used, such as, for example, between zero to 200 μm.

Figure 5:
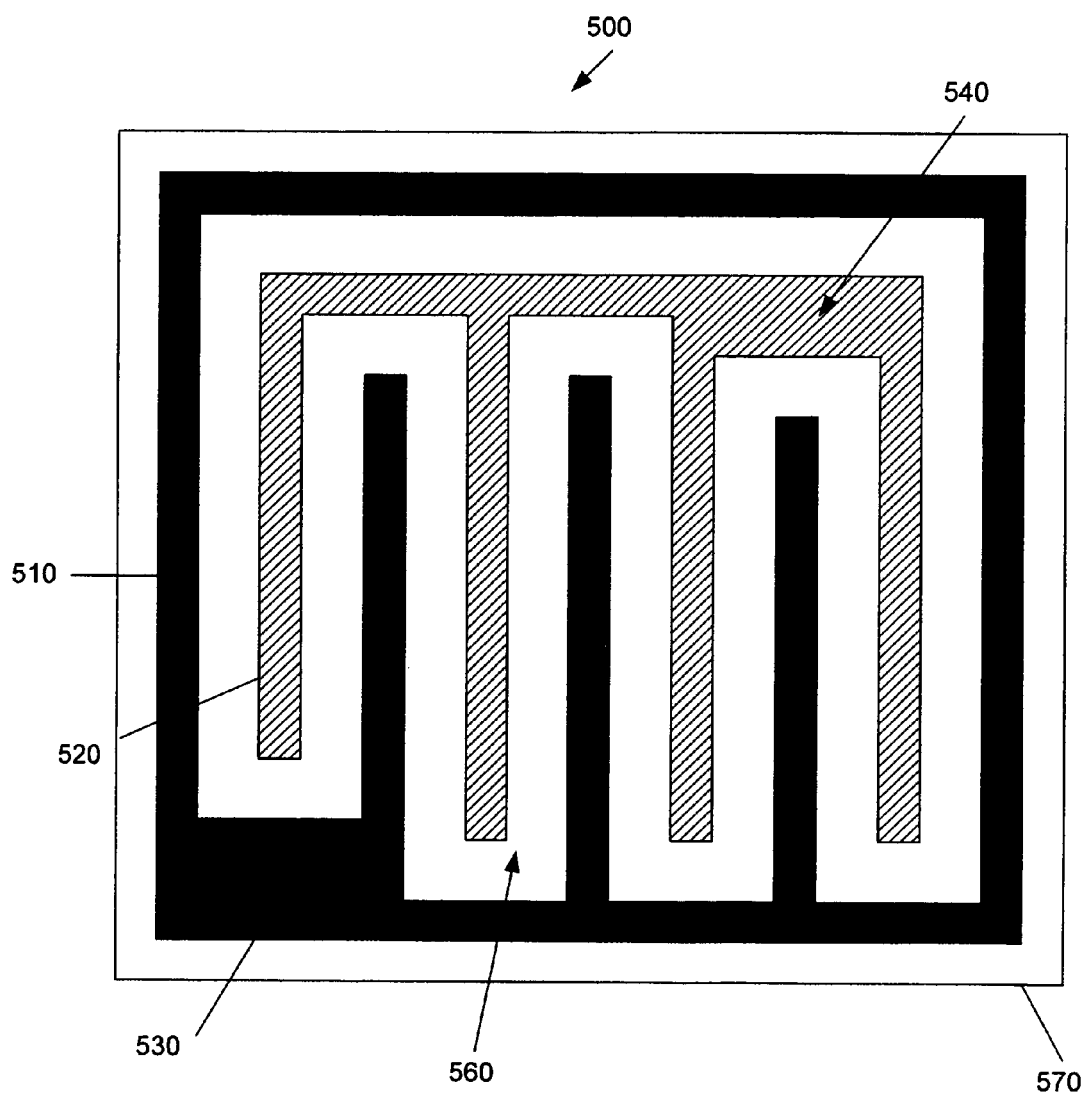
FIG. 5 shows an exemplary single chip, top view layout of a lateral power diode.

FIG. 5 shows an exemplary top view of a single chip 500 incorporating the LPD structure. As shown, an anode area 510 and a cathode n+ metallization area 520 may form interdigitated fingers, connected by a anode bond pad 530 and a cathode bond pad 540, respectively. The passivating dielectric region 560 surrounds the cathode area 520. The entire chip may be formed on a substrate 570. Of course, other configurations of the anode and cathode areas may be implemented, for example, they may form a serpentine layout. Different configurations of the bond pads may be used including multiple anode and cathode bond pads with isolated fingers on the same chip.

Variations of the LPD Cell

Figure 6:
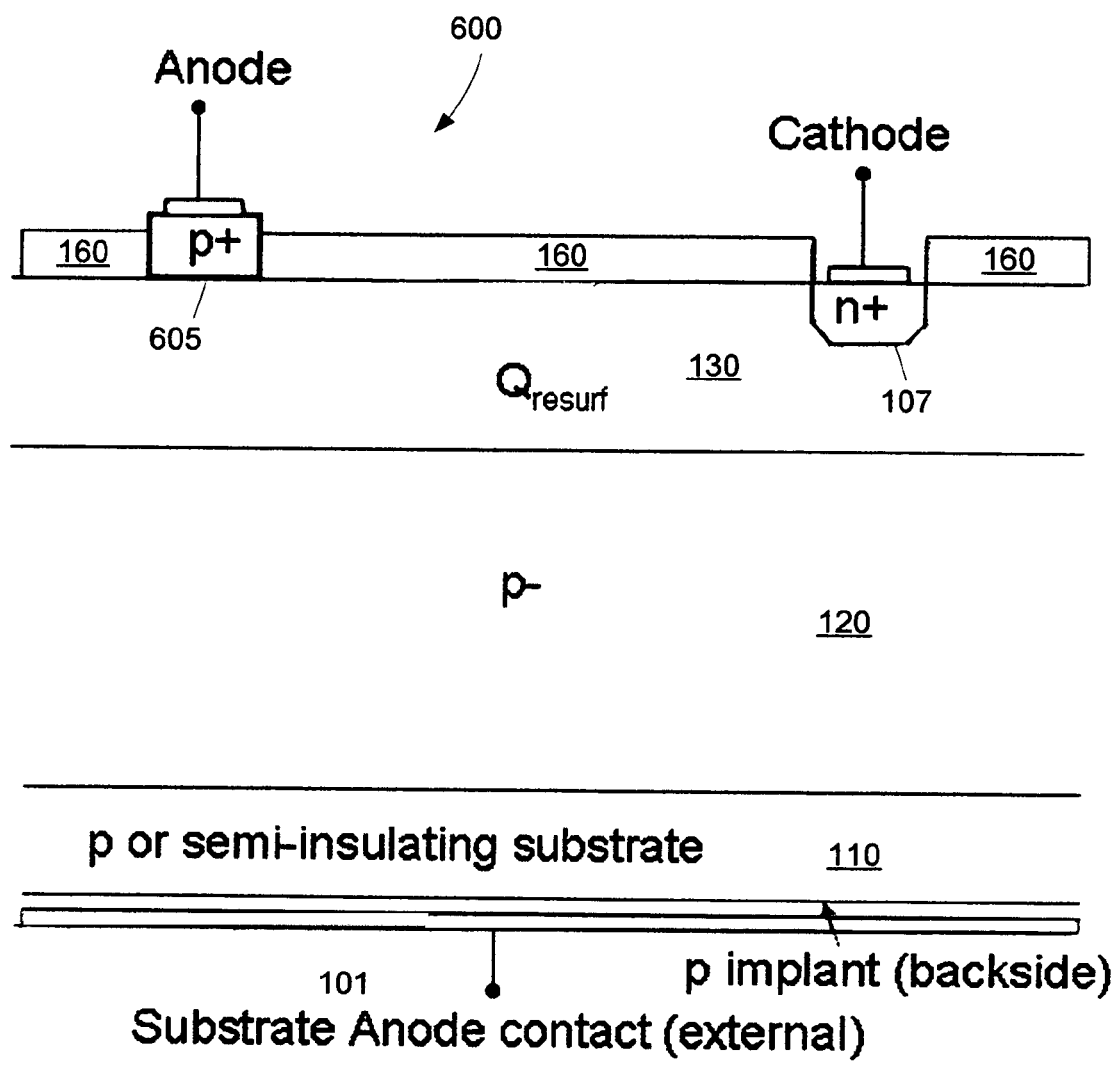
FIG. 6 shows a high voltage lateral power diode with p+ layer instead of a schottky anode.

FIG. 6 shows a high voltage PN junction LPD with p+ injector variation of the LPD structure of FIG. 1. As shown in FIG. 6, a p+ region (i.e., a p+ injector) 605 anode may be used to replace the schottky contact anode 105. As a result, the LPD may be operated in a bipolar mode (instead of a drift-mode as described above). In this variation, instead of a drift current conduction from the anode 105 to the cathode 107, a diffusion method of current conduction is provided between anode 605 and cathode 107. The anode 605 forms a PN junction and injects minority carriers in the forward bias mode of operation. A higher current density is provided by this structure because of the lower resistance offered during minority carrier injection current transport (as compared to the drift mode which is a purely resistive structure).

Figure 7:
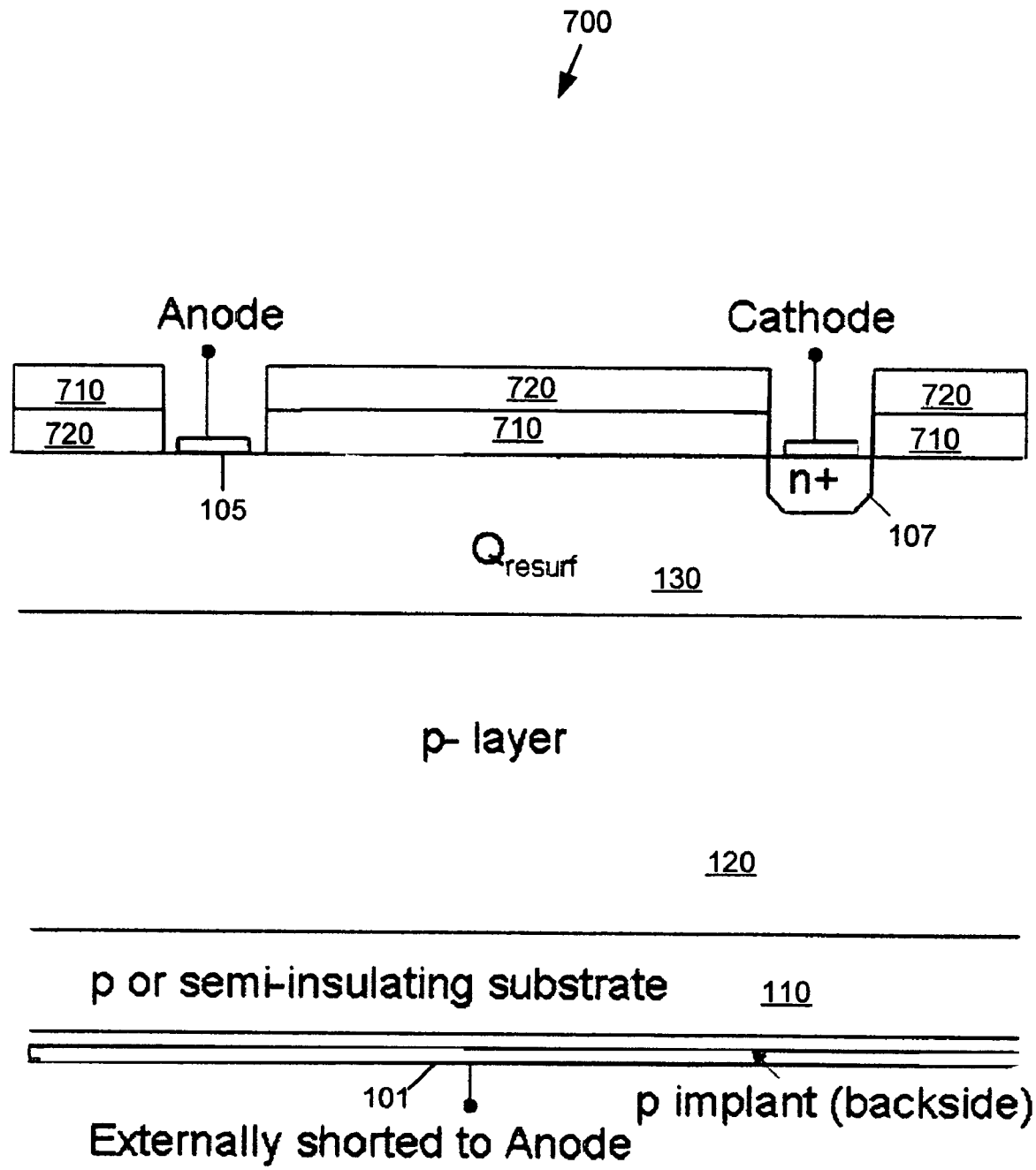
FIG. 7 shows an exemplary lateral power diode with a p compensator layer.

FIG. 7 illustrates another implementation for a high voltage LPD 700 including an optional top p-type layer 710 that may be provided for optimal electric field shaping. The top p-type layer 710 may be implanted in the passivating dielectric layer 720 that is used to fill the area between the anode and cathode. The top p-type layer 710 may be uniformly doped with a thickness such that it is depleted at the inherent PN junction voltage of the semiconductor used. The top p-type compensator layer may be used to suppress the residual electric field of the surface and to reduce the net n-type doping of the diode.

Figure 8:
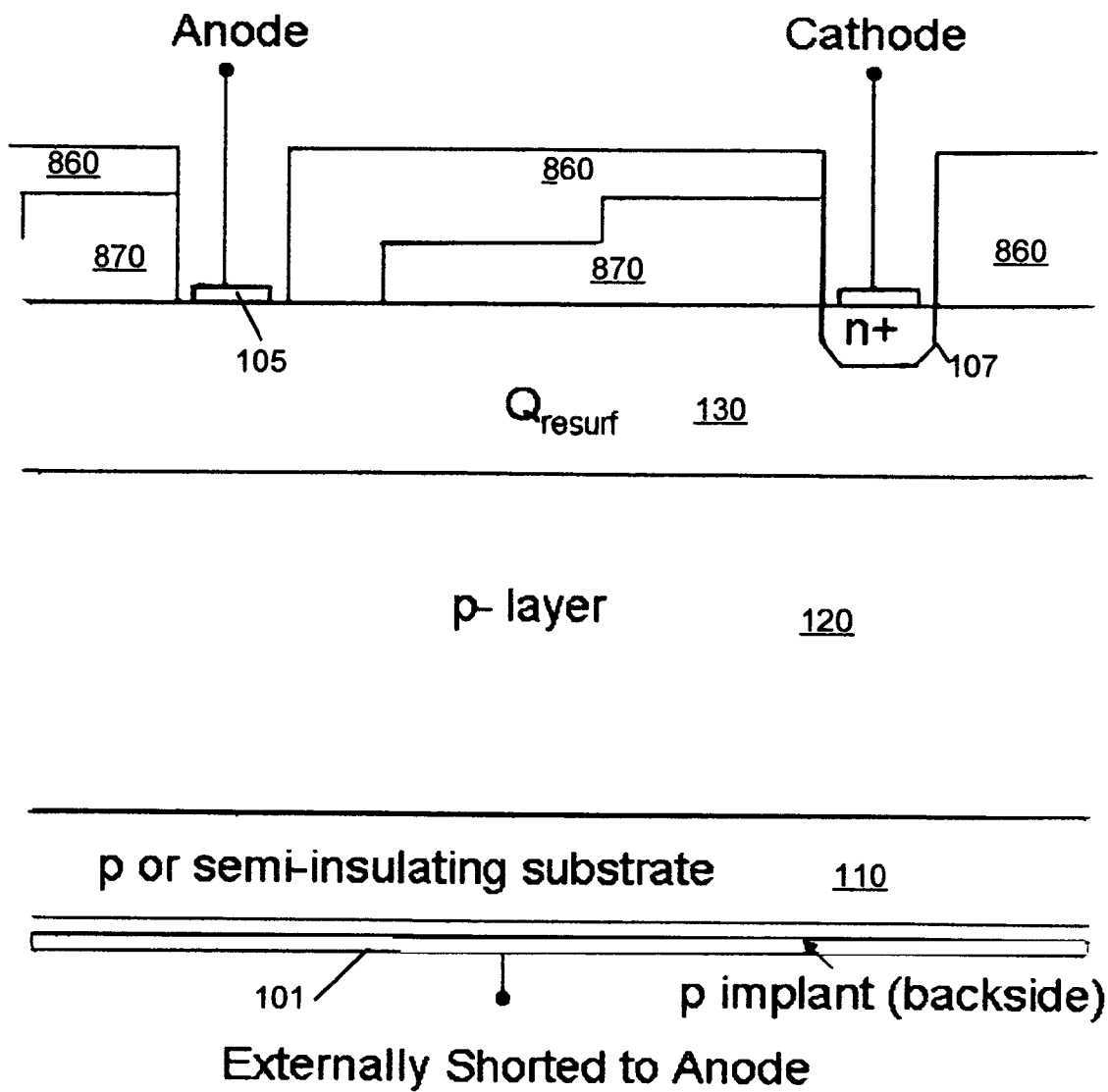
FIG. 8 shows an exemplary lateral power diode with graded doping of the resurf layer.

FIG. 8 shows another implementation of an LPD 800 to provide a stepwise approximation of the optimum linearly increasing dopant charge profile of the layer 130 using a stepwise increasing n-type dopant charge from the anode 105 towards the cathode 107. As shown, the n-type extension of the layer 130 has higher dopant charge approaching the high voltage (cathode) junction. A linearly increasing lateral dopant charge profile from the anode 105 towards the cathode region 107 causes in a uniformly high electric field along the resurf layer 130, resulting in a higher lateral breakdown voltage capability. For a uniform, optimum charge resurf layer 130, the lateral breakdown voltage may be approximately expressed as:

$$BV_{lat}=(0.5)\times(L_{Drift}\times E_{cr}),$$

whereas the linearly increasing lateral dopant charge profile of FIG. 8 has a lateral breakdown voltage that may be expressed as:

$$BV_{lat}=(1)\times(L_{Drift}\times E_{cr})$$

A higher electric field exists at the anode 105 and cathode 107 junctions for a uniformly doped resurf layer 130, while most of the drift region has a lower electric field when the LPD is blocking the maximum voltage. In contrast, the linearly increasing dopant charge from anode to the cathode regions, shown in FIG. 8, provides an electric field that is uniformly high all along the drift layer between, and including, the anode and the cathode regions. The higher electric field provided for the majority of the drift region allows the LPD with a linearly increasing dopant charge profile to laterally block a higher voltage than a LPD having a uniform dopant charge case. Since it is difficult to form a linearly increasing dopant charge profile in widebandgap semiconductors due to processing challenges, a stepwise increasing dopant charge may be used for LPDs to facilitate their fabrication. The stepwise increasing dopant may be implemented by removing excess n-type material closer to the anode region by reactive ion etching or selective area oxidation using photolithography. In another implementation, an increasing dopant charge may be provided using multiple n-type ion implants in a passivating layer 860 between the anode and cathode close to the cathode junction to form an n-type extension 870 of the resurf layer, thereby increasing the doping of the resurf layer in a stepwise manner.

Widebandgap semiconductors like SiC and diamond offer excellent properties for the realization of high performance, next generation power and microwave (RF) devices. These properties include: an order of magnitude higher breakdown electric field; a much higher thermal conductivity; and a wider bandgap than silicon. A high breakdown electric field allows the design of power devices with thinner and higher doped blocking layers. This allows design of power devices with two orders of magnitude lower on-resistance in majority carrier devices. The high thermal conductivity also allows dissipated heat to be readily extracted from the device. The large bandgap results in a much higher operating temperature and higher radiation hardness. As a result, a larger power can be applied to the device for a given junction temperature.

Conventional power and microwave diodes made with these semiconductors face various challenges in terms of performance and ease of manufacture. Three major performance parameters are: on-resistance for a given area (called specific on-resistance), breakdown voltage, and switching speed. There exists a fundamental trade-off between specific on-resistance and the breakdown voltage achieved using a particular thickness of semiconductor. Counter-intuitively, LPDs offer one half to one quarter resistance for a given breakdown voltage as compared to vertical power diodes. Yet a vast majority of conventional diodes are designed with a vertical design because most conventional designs in Si (the dominant material for power device realization) use such a design. A veritical design is used because semi-insulating and insulating versions of Si are difficult to achieve as compared to highly conducting versions. On the other hand, many widebandgap diodes are realized in semi-insulating and insulating versions.

The LPD offers at least the following advantages over conventional vertical diodes. The LPD provides a lower specific on-resistance because of a fundamental trade-off between on-resistance and breakdown voltage. The LPD also provides a lower resistive on-state drop. The theoretical specific on-resistance of a vertical power diode is expressed as:

$$R_{on,sp,VPD} = \frac{4\ BV_{VPD}}{\varepsilon\varepsilon_r\mu E_{cr}^3},$$

where $R_{on,spVPD}$ is the specific on-resistance of the vertical power diode, $BV_{VPD}$ is the theoretical breakdown voltage of a vertical power diode, $\mu$ is the bulk mobility of the current carriers, and $E_{cr}$ is the critical electric field of the semiconductor. The specific on resistance of the LPD may be expressed as:

$$R_{on,sp,LPD} = (\text{Between 1 and 2})\frac{BV_{LPD}}{\varepsilon\varepsilon_r\mu E_{cr}^3}.$$

Therefore, the specific on-resistance (on-resistance for a given chip area) of a LPD is two to four times lower than that formed in vertical power diodes.

Another advantage of the LPD is a significantly smaller total power diode chip size because of the lack of an extensive edge termination region. Conventional vertical power diodes have a lateral edge termination length beyond the anode/cathode contact areas in order to terminate the high electric fields at the edge of these devices. The length of the edge termination region is dependent on the breakdown voltage rating of the diode. The edge termination length is approximately two to five times the thickness of the voltage blocking layers. Since the edge termination region does not contribute to current conduction (it is required to block the voltage), it results in an unused area of the power diode chip with no contribution to the on-resistance.

In contrast, the LPD may provide high voltage cathode terminals that are completely surrounded by the anode terminals (which are close to ground potential during the reverse bias operation of the diode). Therefore, the edge termination length beyond the anode area of the LPD is minimal. This results is a very effective utilization of chip area in case of LPDs, as compared to vertical diodes. This advantage is further increased as the blocking voltage rating of the LPD is increased.

Ion implantation and dopant diffusion are significantly more challenging processes for most widebandgap semiconductor fabrication than for silicon fabrication. Since many power diode designs fabricated from silicon use ion implantation and diffusion, many power diode designs in widebandgap continue to use these steps for conventional device fabrication. These ion implantation steps are required for edge termination designs in conventional power diodes, and these steps result in low yields and high costs for convention power diode fabrication. However, LPDs offer an easy way to avoid these ion implantation steps, because the resurf layer is used to terminate the high electric fields in the device. These resurf layers can be implemented using epitaxial layers for both the uniform dopant charge version, and the optimum stepwise linearly increasing dopant charge versions.

LPDs with schottky contact anodes have lower leakage currents as compared to conventional vertical Schottky diodes because placing the cathode at the rated blocking voltage results in a significantly smaller electric field at the schottky/metal interface (than the field of a vertical power diode). Therefore, the highest electric field point of vertical high voltage diodes is at the schottky interface. In marked contrast, the highest electric field of an LPD exists at the PN junction formed between layer 130 and layer 120 (or layer 110 and layer 130 if layer 120 is not present), below the cathode junction. Since leakage current is exponentially dependent on the electric field at the schottky-semiconductor interface, the leakage current in a LPD is exponentially smaller than in a vertical Schottky diode with the same blocking voltage.

For LPDs with schottky anodes, the on-state voltage drop is further reduced because the built-in voltage drop of a lateral schottky-diode is smaller than that of a similarly rated vertical Schottky diode made with the same schottky metal. This reduction results from the doping of the drift layer in contact with the schottky metal that is more than two orders of magnitude higher than those used to fabricate vertical Schottky diodes. The on-state voltage drop in power schottky diodes may be expressed as:

$$V = c - \phi_M + \chi + \frac{E_G}{2} - \frac{kT}{q}\ln\left(\frac{N_D}{n_i}\right) + J \times R_{on,sp}$$

where c is a constant, $\phi_M$ is the metal electron affinity, X is the semiconductor electron affinity, $E_G$ is the bandgap of the semiconductor, k is the Boltzmann's constant, T is the temperature, q is the electronic charge, $N_D$ is the doping of the semiconductor in intimate contact with the metal, $n_i$ is the intrinsic carrier concentration of the semiconductor, J is the on-state current density, and $R_{on,sp}$ is the specific on-resistance of the Schottky diode.

For most schottky diodes rated greater than 300 V, the semiconductor layer in intimate contact with the metal is doped at least 10 times lower than that required for the LPD (having a doping $N_{resurf}$). Therefore, the LPD has a lower on-state drop than vertical power diodes if all other factors are substantially identical for the two cases.

A number of exemplary implementations have been described. Nevertheless, it will be understood that various modifications may be made. For example, suitable results may be achieved if the steps of described techniques are performed in a different order and/or if components in a described system, architecture, device, or circuit are combined in a different manner and/or replaced or supplemented by other components. Accordingly, other implementations are within the scope of the following claims.

What is claimed is:

1. A lateral power diode (LPD) comprising:
   a substrate layer;
   one or more layers including at least one widebandgap semiconductor layer of a first conductivity type, the one or more layers formed on the substrate;
   a resurf layer of the widebandgap semiconductor having a second conductivity type formed on the at least one layer of the first conductivity type;
   a sub-anode terminal formed on the substrate;

a schottky anode terminal in direct contact with the resurf layer;
a cathode region in contact with the resurf layer spaced apart from the anode; and
a current conduction path in the resurf layer between the anode terminal and the cathode region.

2. The LPD of claim 1 having the current conduction path in the resurf layer has a lateral breakdown voltage between the anode and the cathode region and a vertical breakdown voltage between the cathode region and the sub-anode, wherein the lateral breakdown voltage is less than or equal to the vertical breakdown voltage.

3. The LPD of claim 1 having a blocking voltage of 600 V to 25 kV.

4. The LPD of claim 1 wherein the substrate layer has a carrier concentration of dopant atoms of 0 $cm^{-3}$ to $1 \times 10^{22}$ $cm^{-3}$.

5. The LPD of claim 4 wherein the substrate layer has a thickness of 100 to 500 μm.

6. The LPD of claim 1 wherein the resurf layer has a carrier concentration of dopant atoms of $1 \times 10^{15}$ $cm^{-3}$ to $1 \times 10^{19}$ $cm^{-3}$.

7. The LPD of claim 6 wherein the resurf layer has a thickness of 0.01 to 5 μm.

8. The LPD of claim 1 wherein the at least one layer of the first conductivity type has a carrier concentration of dopant atoms of less than $10^{17}$ $cm^{-3}$.

9. The LPD of claim 1 wherein the widebandgap semiconductor has a bandgap EG greater than 2 eV and less than 8 eV.

10. The LPD of claim 1 wherein the widebandgap semiconductor is one of silicon carbide, diamond, aluminum nitride, and gallium nitride.

11. The LPD of claim 10 wherein the face of the silicon carbide is one of 0001, 000–1, and 11–20.

12. The LPD of claim 1 wherein having a specific on resistance of less than 300 mΩ-$cm^2$.

13. The LPD of claim 1 wherein the first conductivity is p type and the second conductivity is n type.

14. The LPD of claim 1 further comprising a compensating layer of the second conductivity type formed on the resurf layer configured to shape a lateral electric field of the LPD.

15. The LPD of claim 1 wherein the resurf layer has a substantially increasing dose profile of the second conductivity type from the schottky anode to the cathode region.

16. The LPD of claim 1 further comprising an expitaxially grown extension of resurf layer of the second conductivity type between the schottky anode and the cathode region.

17. The LPD of claim 16 wherein the extension provides a substantially increasing dose profile of the second conductivity type from the schottky anode to the cathode region.

18. The LPD of claim 1 further comprising an ion implanted extension of resurf layer of the second conductivity type between the schottky anode and the cathode region.

19. The LPD of claim 18 wherein the extension provides a substantially increasing dose profile of the second conductivity type from the schottky anode to the cathode region.

20. The LPD of claim 1 wherein the junction between the resurf layer of the second conductivity type and the at least one layer of the first conductivity type provides a voltage blocking PN junction below the current conduction path in the resurf layer and the at least one layer provides a substantially continuous, linear gradation of voltage in the resurf layer between the anode terminal and the cathode region.

21. A lateral power diode (LPD) comprising:
a substrate layer;
one or more layers including at least one widebandgap semiconductor layer having a first conductivity type formed on the substrate layer;
a resurf layer of the widebandgap semiconductor having a second conductivity type formed on the at least one layer of the first conductivity type;
a sub-anode terminal formed on the substrate layer;
an anode region in direct contact with the resurf layer having the first conductivity type;
a cathode region, in contact with the resurf layer and spaced apart from the anode terminal, having the second conductivity type; and
a current conduction path in the resurf layer between the anode region and the cathode region.

22. The LPD of claim 21 wherein the first conductivity type is p type and the second conductivity type is n type.

23. The LPD of claim 21 having a lateral breakdown voltage between the anode region and the cathode region and a vertical breakdown voltage between the cathode region and the sub-anode region, wherein the lateral breakdown voltage is less than or equal to the vertical breakdown voltage.

24. The LPD of claim 21 having a blocking voltage of 1200 V to 25 kV.

25. The LPD of claim 21 wherein the substrate layer has a carrier concentration of dopant atoms of 0 $cm^{-3}$ to $1 \times 10^{22}$ $cm^{-3}$.

26. The LPD of claim 25 wherein the substrate layer has a thickness of 100 to 500 μm.

27. The LPD of claim 21 wherein the resurf layer has a carrier concentration of dopant atoms of $1 \times 10^{15}$ $cm^{-3}$ to $1 \times 10^{19}$ $cm^{-3}$.

28. The LPD of claim 27 wherein the resurf layer has a thickness of 0.01 to 5 μm.

29. The LPD of claim 21 wherein the one or more layers of the first conductivity type include a back anode layer.

30. The LPD of claim 29 wherein the at least one layer of the first conductivity type has a carrier concentration of dopant atoms of less than $10^{17}$ $cm^{-3}$.

31. The LPD of claim 30 wherein the at least one layer of the first conductivity type has a thickness of 0.1 to 200 μm.

32. The LPD of claim 21 wherein the widebandgap semiconductor has a bandgap EG greater than 2 eV and less than 8 eV.

33. The LPD of claim 21 wherein widebandgap the semiconductor is one of silicon carbide, diamond, aluminum nitride, and gallium nitride.

34. The LPD of claim 33 wherein the face of the silicon carbide is one of 0001, 000–1, and 11–20.

35. The LPD of claim 21 wherein having a specific on resistance of less than 300 mΩ-$cm^2$.

36. The LPD of claim 21 wherein the junction between the resurf layer of the second conductivity type and the at least one layer of the first conductivity type provides a voltage blocking PN junction below the current conduction path in the resurf layer and the at least one layer provides a substantially continuous, linear gradation of voltage in the resurf layer between the anode region and the cathode region.

37. A lateral power diode (LPD) formed in a widebandgap semiconductor comprising:
one or more layers of the widebandgap semiconductor having a first conductivity and a first and a second surface;

one or more layers of the widebandgap semiconductor having a second conductivity formed in contact with the first surface of the one or more layers of the first conductivity, including at least a resurf layer having a doping profile uniformly decreasing with depth;

a sub-anode formed in contact with the second surface of the one or more layers of the first conductivity;

an anode in direct contact with the resurf layer;

a cathode region in contact with the resurf layer spaced apart from the anode region; and a lateral current conduction path in the one or more layers of the second conductivity type between the anode region and the cathode region.

38. A lateral power diode (LPD) comprising:

one or more layers, including at least one widebandgap semiconductor layer of the first conductivity type, having a first and a second surface;

a resurf layer of the widebandgap semiconductor having a second conductivity type formed on the at least one layer of the first conductivity type at the first surface;

a sub-anode terminal formed on the one or more layers at the second surface;

a schottky anode terminal in direct contact with the resurf layer;

a cathode region in contact with the resurf layer spaced apart from the anode; and a current conduction path in the resurf layer between the anode terminal and the cathode region, wherein the resurf layer has a substantially increasing dose profile from the schottky anode to the cathode region.

39. The LPD of claim 38 wherein the junction between the resurf layer of the second conductivity type and the at least one layer of the first conductivity type provides a voltage blocking PN junction below the current conduction path in the resurf layer and the at least one layer provides a substantially continuous, linear gradation of voltage in the resurf layer between the anode terminal and the cathode region.

40. A lateral power diode (LPD) comprising:

one or more layers, including at least one widebandgap semiconductor layer of the first conductivity type, having a first and a second surface;

a resurf layer of the widebandgap semiconductor having a second conductivity type formed on the at least one layer of the first conductivity type at the first surface;

a sub-anode terminal formed on the one or more layers at the second surface;

an anode region in direct contact with the resurf layer;

a cathode region in contact with the resurf layer spaced apart from the anode; and a current conduction path in the resurf layer between the anode terminal and the cathode region, wherein the resurf layer has a substantially increasing dose profile from the anode region to the cathode region.

41. The LPD of claim 40 wherein the doping $N_{resurf}$ of the resurf layer by thickness of the resurf layer is expressed as range of plus or minus 50% of:

$$\frac{1}{L_{Drift}} \int_0^{tresurf} \int_0^{L_{Drift}} N_{resurf}(x, y) \partial x \partial y = \frac{\epsilon \times E_{cr}}{q}$$

where $E_{cr}$ is the critical breakdown electric field of the semiconductor, $\epsilon$ is the dielectric constant of the semiconductor, 'q' is the electronic charge, and $L_{Drift}$ is the distance between the cathode region and the anode region.

42. The LPD of claim 40, wherein the anode region is located at a distance $L_{Drift}$ from the cathode region where $L_{Drift}$ is expressed as:

$$L_{Drift} = \frac{(\text{Between 2 and 1}) \times BV_{Lat}}{E_{cr}}$$

where $BV_{lat}$ is the lateral breakdown voltage between anode and cathode and $E_{cr}$ is the critical electric field of the semiconductor.

43. The LPD of claim 40 wherein the junction between the resurf layer of the second conductivity type and the at least one layer of the first conductivity type provides a voltage blocking PN junction below the current conduction path in the resurf layer and the at least one layer provides a substantially continuous, linear gradation of voltage in the resurf layer between the anode region and the cathode region.

* * * * *